United States Patent
Omizo

[11] Patent Number: 6,143,587
[45] Date of Patent: Nov. 7, 2000

[54] METHOD OF MARKING ON SEMICONDUCTOR DEVICE HAVING METALLIC LAYER

[75] Inventor: Shoko Omizo, Kawasaki, Japan

[73] Assignee: Kabushiki Kaisha Toshiba, Kawasaki, Japan

[21] Appl. No.: 09/199,425

[22] Filed: Nov. 25, 1998

[30] Foreign Application Priority Data

Nov. 28, 1997  [JP]  Japan .................................. 9-328360

[51] Int. Cl.⁷ ................................................... H01L 21/44
[52] U.S. Cl. ............................................. 438/106; 438/16
[58] Field of Search ................................... 438/4, 5, 7, 14, 438/16, 106, 121, 631, 632, 636, 940; 148/508, 511, 512, 525; 427/457, 96; 428/655; 228/203

[56] References Cited

U.S. PATENT DOCUMENTS 4,122,240  10/1978  Banas et al. ............................ 428/655
4,830,265   5/1989  Kennedy et al. ....................... 228/203

*Primary Examiner*—Charles Bowers
*Assistant Examiner*—Keith Christianson
*Attorney, Agent, or Firm*—Finnegan, Henderson, Farabow, Garrett & Dunner, L. L. P.

[57] ABSTRACT

This marking method is carried out with an object to form a mark of high visibility on a surface of a metallic layer of such as a cover plate of a semiconductor device or the like without generating metallic debris or the like. According to this method, on a marking area of a metallic layer with a matte surface ($R_{max}$:0.5 to 5 $\mu$m), a laser beam is illuminated, thereby the metallic layer is melted, then re-solidified, thereby minute unevenness on the surface of the metallic layer is averaged and erased to be smooth. Thus formed marking portion reflects light specularly and is different in light reflectivity from an underlying portion which scatters light (diffuse reflection). Due to the difference of reflectivity, the marking portion can be visually discerned with excellency.

4 Claims, 4 Drawing Sheets

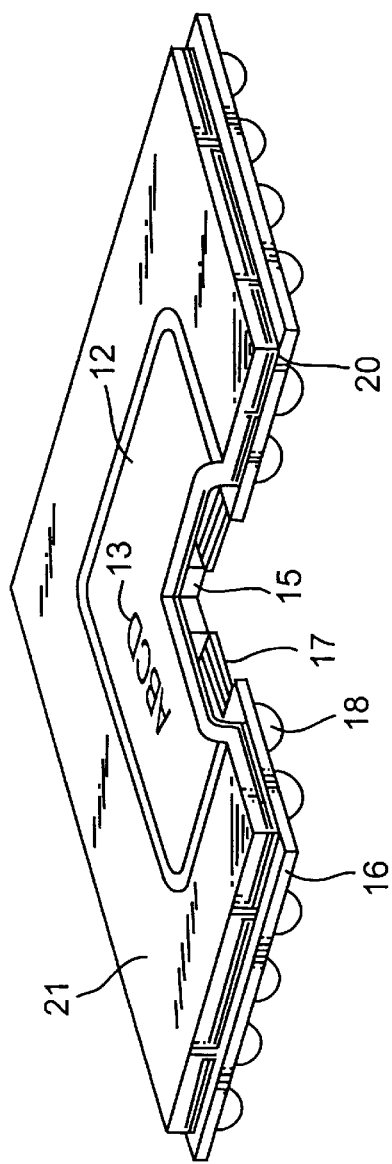
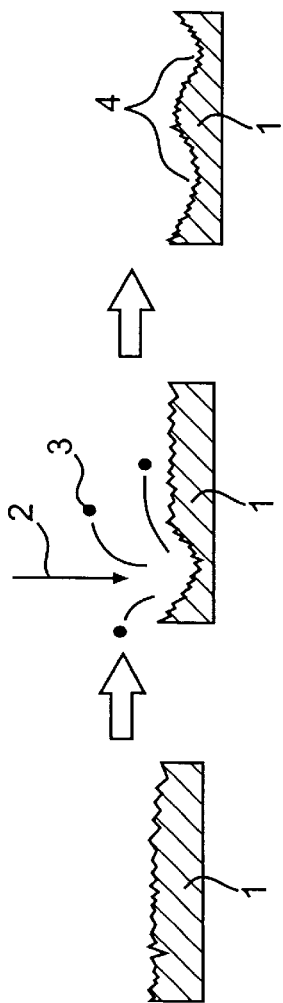
FIG. 5
FIG. 6 PRIOR ART

METHOD OF MARKING ON SEMICONDUCTOR DEVICE HAVING METALLIC LAYER

BACKGROUND OF THE INVENTION

1. Field of the Invention

The present invention relates to a method of marking marks on a metallic layer, and a metallic layer with marks and a semiconductor device having the metallic layer, in more detail, relates to a method of marking marks (emblem) such as characters, codes, patterns or the like by illuminating a laser beam on a surface of a metallic layer, a metallic layer with marks thereon, and a semiconductor having a metallic layer with marks thereon.

2. Description of Related Art

So far, as a method of marking marks such as characters, codes, patterns or the like on a surface of a metallic member in order to indicate product names, product specifications, logotypes, product lot numbers or the like, such as shown in FIG. 6, a laser marking method of illuminating a laser beam 2 on a surface of a metallic layer 1 is known. According to this method, the energy of the illuminated laser beam 2 sublimes metal particles or spatters metallic debris 3 from the surface of the metallic layer 1 to dig concave portions thereon, the dug portions 4 being the marking portions.

However, in the case of applying such so far employed marking method to a metallic member in which an underlying metallic layer is covered by a thin metallic plating layer, due to illumination of a laser beam 2, a part or all of the plating layer is removed. Here, since corrosion reaction such as oxidation or the like occurs due to exposure of the underlying metal, there is a problem such as deterioration of visibility occurs.

In a BGA (ball grid array) type semiconductor device having a heat-radiating cover plate, for instance, though a cover plate covered by a nickel plating layer (thickness of 2 to 10 $\mu$m) is disposed on a surface of a copper plate for preventing from rusting, in the case of carrying out marking by conventional illumination of a laser beam on such a cover plate, the nickel plating layer is removed to expose the underlying copper layer, due to corrosion of copper, the visibility of the dug portions 4 is deteriorated.

Further, in the conventional method, the marking is carried out by deleting the surface of the metallic layer 1, air contaminating substances such as metallic debris 3 or metal particles are generated, accordingly measures such as dust collection or the like were necessary. Further, there is a troublesome problem such that, in order for the generated and floating metallic debris 3 or the like not to interrupt the laser beam 2, digging operation is required to be carried out while evacuating/removing these floating materials by a suction pump.

SUMMARY OF THE INVENTION

The present invention was carried out to solve these problems. That is, an object of the present invention is to provide a marking method which, by illuminating a laser beam on a surface of a metallic layer, forms marks of excellent visibility, and does not generate air-contaminating materials such as metallic debris or the like, a metallic layer with marks of excellent visibility, and a semiconductor device having a metallic layer with such marks.

A method of marking on a metallic layer of the first invention of the present invention illuminates a laser beam on a predetermined marking area of a metallic layer having the maximum surface roughness ($R_{max}$) of 0.5 to 5 $\mu$m, thereby melts a neighboring area of the surface of the metallic layer and then solidifies again the area, thus forms a marking portion having different light reflectivity from the underlying portion of the metallic layer.

A metallic layer with a mark of the second invention of the present invention comprises an underlying portion having the maximum surface roughness ($R_{max}$) of 0.5 to 5 $\mu$m, and a marking portion having different light reflectivity from that of the underlying portion.

Further, a semiconductor device of the third invention of the present invention comprises the aforementioned metallic layer with marks.

In the marking method of the present invention, the surface of the metallic layer thereon the laser beam is illuminated is a matte surface (non-glossy surface) having minute unevenness, the surface roughness being 0.5 to 5 $\mu$m by the maximum value ($R_{max}$). In the case of the maximum surface roughness (hereinafter refers to as $R_{max}$) being out of the aforementioned range, scattering property on the surface of the underlying portion which is a non-marking portion becomes insufficient. Since the difference of the light reflectivity from that of the marking portion formed by the illumination of a laser beam becomes small, the visibility of the marking portion becomes insufficient. The more preferable $R_{max}$ is in the range of 1 to 3 $\mu$m.

Further, in the method of the present invention, as a method of illuminating a beam of laser only on a predetermined marking area, there is an imaged-mask laser system which illuminates a laser beam through an exposing mask having a predetermined pattern, or a steered-beam laser writing system in which a focused point of the laser beam is scanned continuously by use of computer-driven mirrors mounted on galvanometers. In the steered-beam laser writing system, by moving 2 prisms (or reflecting mirrors) for transferring in X-axis direction and in Y-axis direction, respectively, by a linear motor each, the laser beam is scanned in parallel with the X-axis and Y-axis directions with excellent accuracy.

In the method of the present invention, on a marking area of a surface of a metallic layer having various sizes of unevenness with the $R_{max}$ of 0.5 to 5 $\mu$m, a laser beam of such as a YAG laser or the like is illuminated, thereby the neighborhood of the surface of the metallic layer of the marking area is melted by the energy of the laser and solidified again thereafter. The surface of the marking area thus melted and solidified thereafter, though there remaining the waviness (swelling) of large wavelength, gives a smooth surface in which the minute unevenness of 0.1 to 0.3 $\mu$m is leveled and erased. And, as shown in FIG. 1A enlarged, this smooth surface 5 reflects specularly an incident light 6 in one direction according to the law of reflection. On the other hand, the surface of the underlying portion other than the marking area of the metallic layer, as shown in FIG. 1B, is a matte surface 7 of various sizes of unevenness, accordingly the beams of the incident light 6 are scattered evenly in all directions (diffuse reflection). Therefore, due to such a difference in reflectivity of light, as a dark part formed in the underlying portion which is seen bright (white) from any directions, the marking area can be seen with high contrast.

Since formation of the marking area of the present invention is carried out according to such the principle, illumination energy of the laser beam is set at the degree which is necessary and sufficient to melt the metallic layer in an appropriate time period (relatively slowly). When the energy of the laser beam is illuminated too much, the surface of the metallic layer is rapidly melted to erupt, thereby a concave portion like a crater of a large diameter and of depth is formed on the marking portion, and on the circumference of the concave a swelling portion like a milk crown is formed. Accordingly, the visibility and quality of the marking area deteriorate. The preferable condition for laser illumination, in the case of illuminating a Q-switched YAG laser according to a scanning method for instance, is in the range of 10 to 44 W for the laser output and in the range of 100 to 600 mm/s for the scanning speed.

Thus, since the marks formed according to the method of the present invention are excellent in its contrast with respect to the surrounding underlying portion, not only it can be seen readily by the naked eyes but also it can be discerned by an image recognition device. By adjusting the illuminating energy of the laser, being melted with an adequate speed without digging/cutting or rapidly melting the metallic layer, even on a thin metallic plating layer, a mark of excellent visibility and quality can be formed.

Further, according to such the method of the present invention, marks are formed by melting a metallic layer, accordingly there is no occurrence of the air contaminant such as metallic debris during marking and workability is excellent.

BRIEF DESCRIPTION OF THE DRAWINGS

FIG. 5 is a perspective view showing a structure of the second embodiment of a semiconductor device involving the present invention, FIG. 6 is a cross-sectional view for explaining a marking method due to conventional laser illumination.

DETAILED DESCRIPTION OF THE PREFERRED EMBODIMENTS

In the following, the preferred embodiment of the present invention will be described. Embodiment 1

Figure 2:
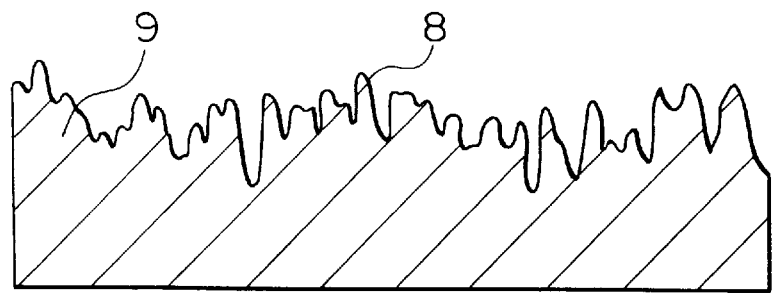
FIG. 2 is a cross-sectional view for explaining the first embodiment of the method of forming a mark on a metallic layer involving the present invention.
Figure 2:
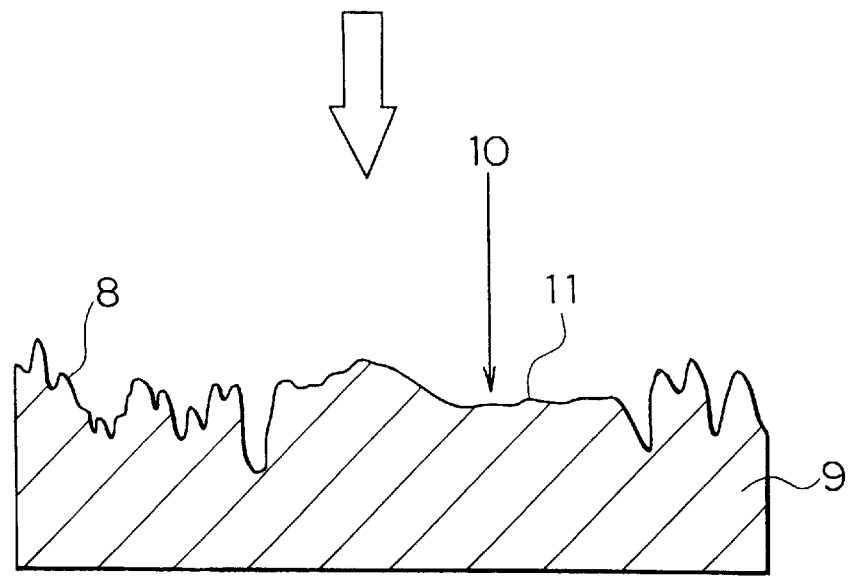
Figure 2:
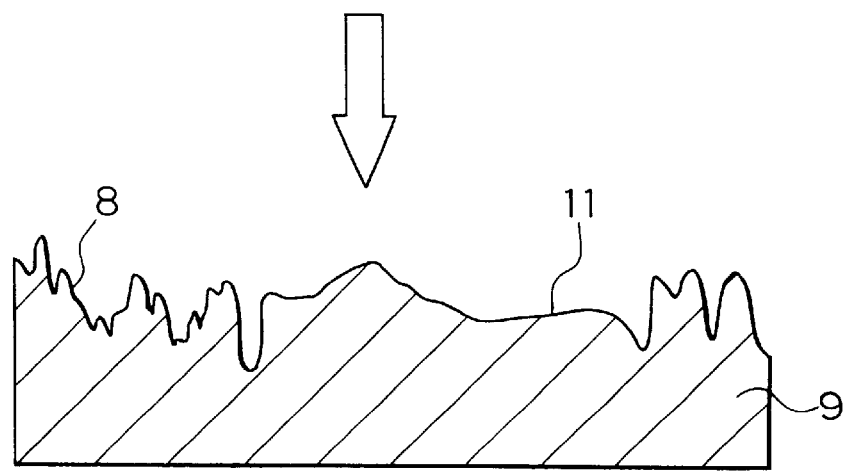

As shown in FIG. 2, on a predetermined marking area on a surface of a metallic layer 9 having minute unevenness 8 of various sizes (with the $R_{max}$ of 0.5 to 5 μm), a laser beam 10 such as YAG laser or the like is illuminated. Then, the neighborhood of the surface of the metallic layer 9, after being melted by the energy of the illuminated laser, is solidified again. Thereby, the marking area, though there remaining unevenness of large wavelength (waviness), becomes a smooth surface 11 in which the minute unevenness of the sides of 0.1 to 0.3 μm is leveled and erased. The portion which is made the smooth surface 11 becomes a marking portion having visibility against the underlying portion.

Figure 1A:
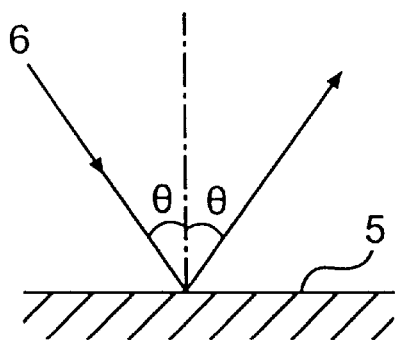
FIG. 1A and FIG. 1B are cross-sectional views showing schematically the difference of light reflectivity between a marking portion formed according to the method of the present invention and an underlying portion.
Figure 1B:
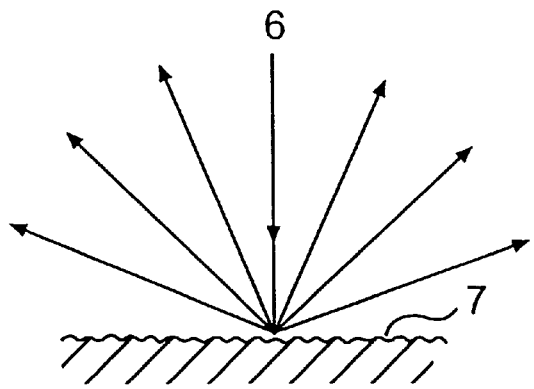
Figure 3:
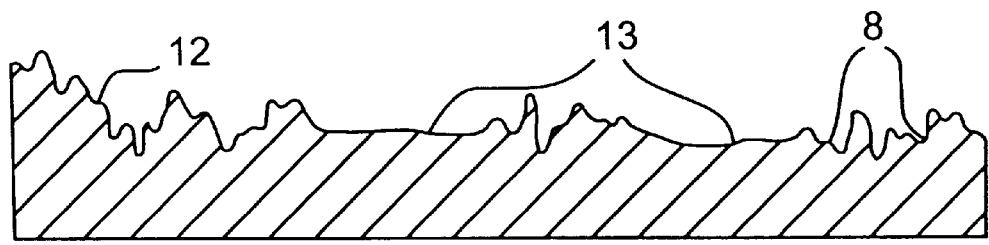
FIG. 3 is a cross-sectional view showing a configuration of the first embodiment of the metallic layer involving the present invention.

The metallic layer marked thereon according to the first embodiment is shown in FIG. 3. The metallic layer is composed of an underlying portion 12 having the minute unevenness 8 of the $R_{max}$ of 0.5 to 5 μm and a marking portion 13 having a smooth surface of different reflectance from the underlying portion 12. In this metallic layer, whereas the surface having the minute unevenness of the underlying portion 12 scatters the incident light almost evenly in all directions (diffuse reflection), the smooth surface of the marking portion 13 reflects specularly the incident light in one direction according to the law of reflection. Due to such the difference of the light reflectivity, the marking portion 13 can be seen clearly by the naked eyes.

Figure 4:
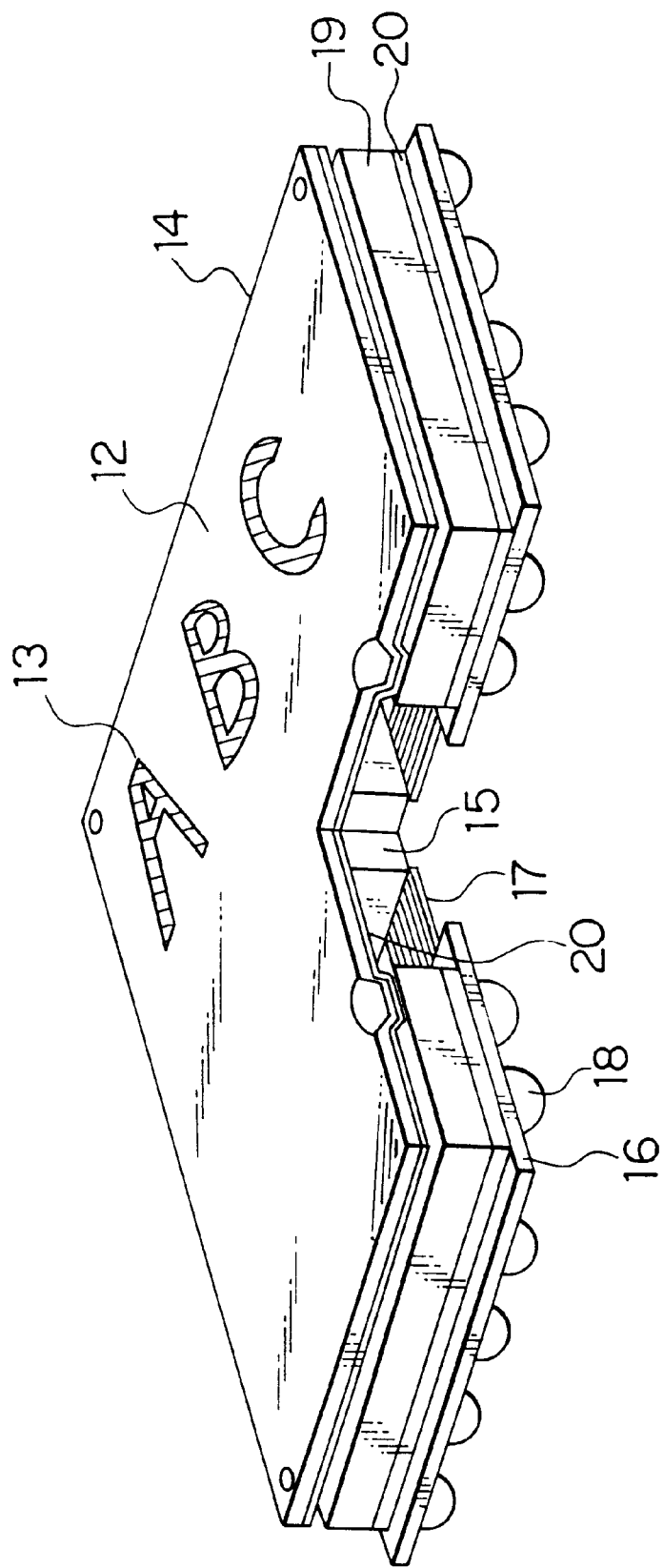
FIG. 4 is a perspective view showing a structure of the first embodiment of a semiconductor device involving the present invention.

Further, a semiconductor device of the first embodiment has a cover plate having such a metallic layer. That is, in this semiconductor device, as shown in FIG. 4, the cover plate 14 has a structure in which a surface of a copper plate is covered by a layer of nickel plating of the $R_{max}$ of 0.5 to 5 μm. And, on the underlying portion 12 of the nickel plating layer, the marking portion 13 having a smooth surface of which reflectivity is different from that of the underlying portion 12 is formed. Further, in this figure, reference numeral 15 denotes a semiconductor chip, 16 denotes an insulating resin film such as polyimide resin film, 17 denotes a copper wiring layer (inner lead) disposed on one surface of the insulating resin film 16, 18 denotes solder balls which are bumps for external connection, 19 denotes a stiffener (plate for maintaining shape), and 20 denotes an adherent layer. Embodiment 2

In the semiconductor device of the second embodiment, as shown in FIG. 5, on the upper side of the insulating resin film 16 and the semiconductor chip 15, a cover cap having shape-maintainability (stiffener-integrated cap) 21 is disposed. The stiffener-integrated cap 21 has a structure in which the surface of the cap body of copper is covered by a layer of nickel plating of the $R_{max}$ of 0.5 to 5 μm, and, on the underlying portion 12 of this nickel plating layer, the marking portion 13 having a smooth surface of different reflectivity from that of the underlying layer 12, by illumination of the laser beam as identical as the first embodiment, is formed by melting the vicinity of the surface of the plating layer and by solidifying it again. Further, in FIG. 5, the other portion, being constituted as identical as FIG. 4, is omitted of explanation.

In the semiconductor device of the second embodiment, the surface of the marking portion 13 formed on the layer of nickel plating, being a smooth surface in which the minute unevenness is erased by leveling the same, has specular reflectivity, accordingly has an excellent visibility against the underlying portion 12. Embodiment 3

Next, a more specific embodiment of the present invention will be described.

In a BGA type semiconductor device shown in FIG. 4, on a surface (a marking area) of the nickel plating of the cover plate 14, by illuminating a laser beam by use of a Q-switched YAG laser (45 W class) of pencil type, a marking portion 13 was formed. Here, the cover plate 14 had a structure in which a nickel plating layer of a thickness of 2 to 7 μm was disposed on a surface of a copper plate, and the surface of the nickel plating layer was a matte surface of the $R_{max}$ of 1 μm. Further, frequencies of the Q-switch, current values of an exciting arc-lamp, laser out powers, and scanning speed all of which represented illuminating conditions of a laser were shown in table 1, respectively.

In examples 1 to 3, the surfaces of the marking portions 13 formed by illuminating the laser beam were smooth surfaces of which the minute unevenness were erased by melting/solidifying the nickel plating layer, accordingly there was only specular reflection and hardly occurred scattering of light, resulting in showing up as a dark portion. Being the contrast against the white and matte underlying portion 12 excellent, it was seen with sufficient visibility by the naked eyes.

Further, in order to investigate the thermal effect affected on the semiconductor device by the laser illumination, in examples 1 to 3, a thermocouple was attached on the surface of the nickel plating layer of the cover plate 14 to measure the temperature increase during the laser illumination.

According to the results, the temperature of the cover plate 14 was elevated by approximately 50° C. from the room temperature, however, returned to the room temperature in approximately 40 sec after start of temperature elevation. Thus, adverse affect due to the temperature elevation was not utterly observed.

Further, in examples 1 to 3, in each cover plate 14 formed marking portion 13 thereon, the thickness of the nickel plating layer of the marking portion 13 and that of the surrounding underlying portion 12 were measured respectively. The measured results are shown in Table 1.

TABLE 1

|  | Example 1 | | | Example 2 | | | Example 3 | | |
| --- | --- | --- | --- | --- | --- | --- | --- | --- | --- |
|  | Illuminating condition | | | | | | | | |
| Frequency of Q-switch (kHz) | 10 | | | 12 | | | 10 | | |
| Lamp current (A) | 18 | | | 19 | | | 20 | | |
| Laser output (W) | 13.8 | | | 16 | | | 17.8 | | |
| Scanning speed (mm/s) | 100 | | | 100 | | | 100 | | |
| Surface roughness $R_{max}$ (μm) | 1 | 1 | 1 | 1 | 1 | 1 | 1 | 1 | 1 |
| Thickness of plating layer of marking portion (μm) | 6.34 | 3.57 | 2.56 | 5.20 | 3.53 | 2.62 | 4.11 | 3.45 | 2.35 |
| Thickness of plating layer of underlying layer (μm) | 6.79 | 3.61 | 2.67 | 5.39 | 3.96 | 2.91 | 4.04 | 3.82 | 2.33 |

As evident from the above measured results, there was hardly seen any significant difference of the thicknesses of the nickel plating layers of the marking portion 13 and the underlying portion 12, and the underlying copper was not exposed at all.

Further, in the semiconductor device of the BGA type shown in FIG. 5, on a nickel plating layer (thickness:2 to 10 μm) of the surface of the stiffener-integrated cap 21, with use of a Q-switched YAG laser (80 W class) of pencil type, the laser beam is illuminated in a predetermined character pattern. The $R_{max}$ of the nickel plating layer at this time and frequencies of Q-switch, current values of exciting arc lamp, laser output powers, and scanning speeds are shown in Table 2, respectively.

Then, the visibility of the marking portion 13 formed by illumination of the laser beam is checked by the visual inspection. The results are shown in the lowest row of Table 2. The evaluation of the visibility is shown by Δ for sufficient visibility, and by ○ for particularly excellent contrast against the underlying portion 12 and excellent visibility.

TABLE 2

| | Example 4 | | | Example 5 | | | Example 6 | | |
|---|---|---|---|---|---|---|---|---|---|
| Surface roughness $R_{max}$ (μm) | 2.5 to 3 | | | 1 to 1.5 | | | 1 to 1.7 | | |
| Illuminating condition | | | | | | | | | |
| Frequency of Q-switch (kHz) | 25 | | | 25 | | | 25 | | |
| Scanning speed (mm/s) | 207 | | | 207 | | | 207 | | |
| Lamp current (A) | 22 | 23 | 24 | 22 | 23 | 24 | 22 | 23 | 24 |
| Laser output (W) | 15.0 | 21.0 | 22.2 | 15.0 | 21.0 | 22.2 | 15.0 | 21.0 | 22.2 |
| Visibility | Δ | Δ | ○ | ○ | ○ | Δ | ○ | ○ | Δ |

As can be seen from this table, in examples 4 to 6, the marking portions 13 formed on the nickel plating layers had sufficient visibility with respect to the matte underlying portions 12.

Incidentally, in the aforementioned embodiment, the method of marking on the cover plate of the BGA type semiconductor device or the nickel plating layer of the stiffener-integrated type cap, and a semiconductor device having a cover plate or a stiffener-integrated type cap thereon such mark is formed were explained. However, the present invention is not restricted to the above, and the identical effect can be obtained even when the present invention is applied in marking the leads of the various kinds of semiconductor device such as the semiconductor device provided with a ceramic substrate, and the other metallic member.

As obvious from the aforementioned explanation, according to the method of the present invention, on the surface of the metallic layer having minute unevenness, by illumination of the laser beam, a marking portion of reflectivity largely different from that of the underlying portion and of excellent visibility can be readily formed. And, even in the case of marking on the thin plating layer such as the cover plate of the semiconductor device being carried out for instance, there is no chance of exposing the metallic layer of the underlying layer by deleting the plating layer, accordingly, without occurrence of corrosion of the underlying metallic layer, excellent visibility can be secured for a long term.

Further, since the marking portion is formed by melting the surface of the metallic layer, in addition to not generating air contaminant such as metallic debris during formation thereof, compared with the conventional method which forms the marking portion by cutting the surface, the energy illuminated by the laser can be spared.

What is claimed is:

1. A method of marking on a metallic layer, characterized in that, by illuminating a laser beam on a marking area of a metallic layer having the maximum surface roughness ($R_{max}$) of 0.5 to 5 μm, a neighboring area of a surface of the metallic layer is melted, then re-solidified, thereby minute unevenness of a size of 0.1 to 0.3 μm on the surface of the metallic layer is averaged and erased to form a smooth surface reflecting specularly an incident light in one direction in the marking area.

2. The method of marking on a metallic layer as set forth in claim 1:

wherein a beam of Q-switched pulsed YAG laser output power of which is 10 to 44 W is illuminated according to a scanning method.

3. The method of marking on a metallic layer as set forth in claim 2:

wherein a scanning speed of the beam of the YAG laser is in the range of 100 to 600 mm/s.

4. The method of marking on a metallic layer as set forth in claim 1:

wherein the metallic layer is a nickel plating layer disposed on a surface of a metallic covering member of a semiconductor device.

* * * * *

UNITED STATES PATENT AND TRADEMARK OFFICE
CERTIFICATE OF CORRECTION

PATENT NO.: 6,143,587

DATED: November 7, 2000

INVENTOR(S): Omizo

It is certified that an error appears in the above-identified patent and that said Letters Patent is hereby corrected as shown below:

Title page, in the "Attorney, Agent, or Firm," change "L. L. P." to --"L.L.P.".

Claim 1, column 8, line 27, before "marking area" insert --predetermined--.

Signed and Sealed this

First Day of May, 2001

Attest:

NICHOLAS P. GODICI

Attesting Officer     Acting Director of the United States Patent and Trademark Office